(12) United States Patent
Murphy et al.

(10) Patent No.: US 6,833,704 B1
(45) Date of Patent: Dec. 21, 2004

(54) MULTINUCLEAR WANDS

(75) Inventors: Joseph Murphy, South San Francisco, CA (US); James Finnigan, Santa Clara, CA (US); Weston Anderson, Palo Alto, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 10/624,744

(22) Filed: Jul. 21, 2003

(51) Int. Cl.[7] ............................................. G01V 3/00
(52) U.S. Cl. ................................... 324/318; 324/322
(58) Field of Search ................................ 324/318–322; 600/410, 423; 361/287

(56) References Cited

U.S. PATENT DOCUMENTS

| | | | |
|---|---|---|---|
| 3,624,508 A | 11/1971 | Kach | |
| 4,881,034 A | 11/1989 | Kaufman et al. | |
| 4,996,482 A * | 2/1991 | Fujito | 324/318 |
| 5,166,617 A | 11/1992 | Ni | |
| 5,390,673 A * | 2/1995 | Kikinis | 600/410 |
| 5,552,710 A | 9/1996 | Busse-Grawitz et al. | |
| 5,768,089 A | 6/1998 | Finnigan | |
| 5,982,179 A | 11/1999 | Munsell et al. | |
| 6,081,120 A | 6/2000 | Shen | |
| 6,714,809 B2 * | 3/2004 | Lee et al. | 600/423 |
| 2002/0040185 A1 * | 4/2002 | Atalar et al. | 600/423 |
| 2002/0161421 A1 * | 10/2002 | Lee et al. | 607/116 |

* cited by examiner

*Primary Examiner*—Diego Gutierrez
*Assistant Examiner*—Tiffany A. Fetzner
(74) *Attorney, Agent, or Firm*—Bella Fishman

(57) ABSTRACT

An insertable wand is used in a multi-nuclear NMR probe enabling the probe to detect and obtain data from various combinations of nuclei. The particular combination of frequencies is determined by various electrical components, and parts within the wand that are designed to cooperate with a tube, to form an adjustable ¼ wave assembly. The adjustable ¼ wave assembly component in the wand comprises a metal rod with an adjustable conductive collar and spring contacts such that when inserted into the tube, the rod and the tube to form an adjustable ¼ wave circuit or a ¼ wave shorted stub. The tube may form part of the wand or the probe. When the wand is plugged into the probe, the combination of the NMR coil within the probe and the adjustable ¼ wave shorted stub provides means for the NMR circuit to resonate at two separate frequencies.

18 Claims, 5 Drawing Sheets

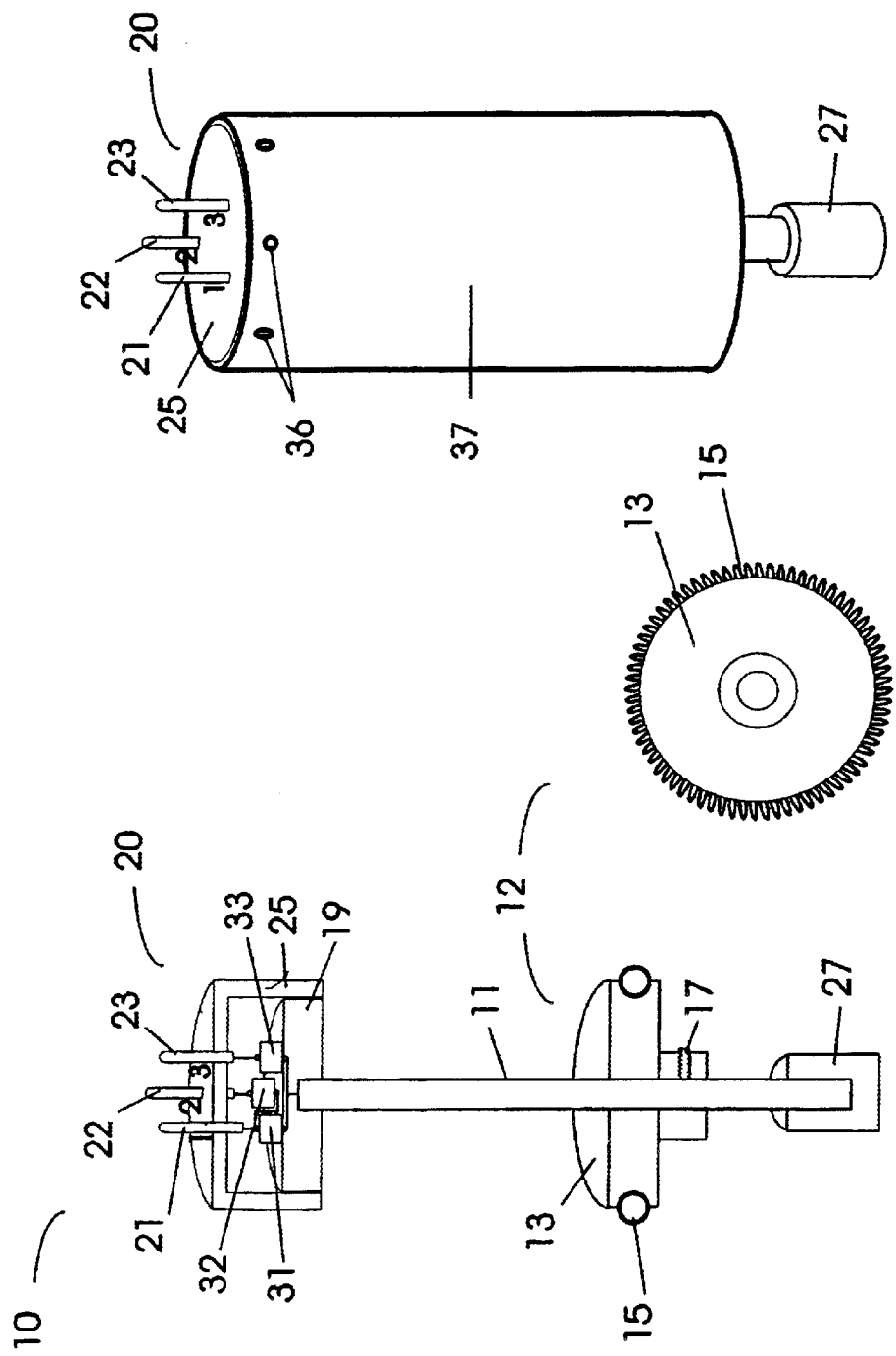

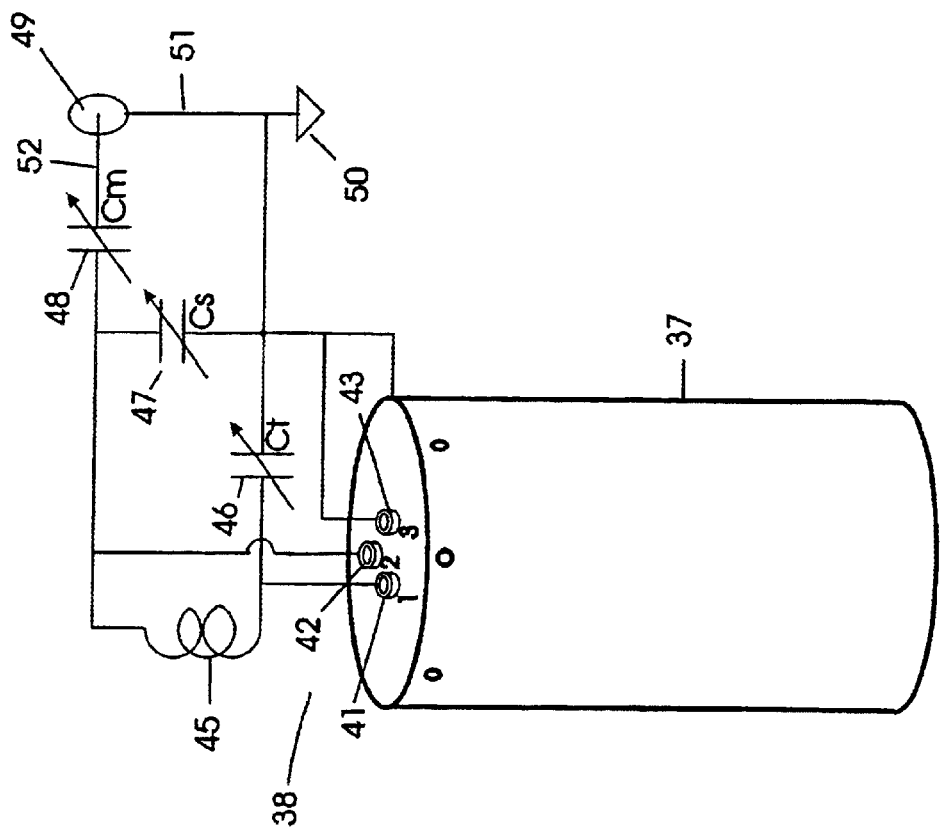
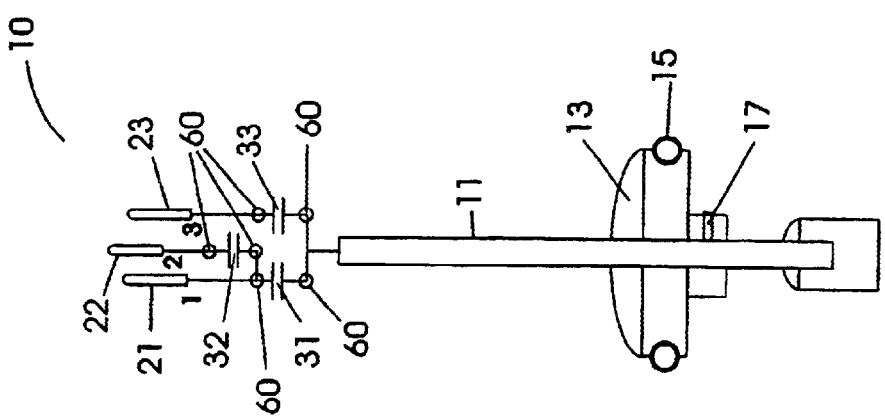
FIG 5
FIG 4

MULTINUCLEAR WANDS

FIELD OF THE INVENTION

This invention is in the field of nuclear magnetic resonance (NMR) apparatus and relates to an adjustable plug-in wand to facilitate either single-frequency operation or multi-nuclei operation of the probe wherein the particular choice of nuclei is determined by the plug-in wand.

BACKGROUND OF THE INVENTION

NMR spectrometers typically include a probe containing the sample to be analyzed, a superconducting magnet for generating a static magnetic field $B_0$, and console unit containing the electronic equipment needed to operate the spectrometer system. The probe contains one or more radio-frequency (RF) coils surrounding the sample for generating time-varying magnetic fields $B_1$ perpendicular to the static magnetic field $B_0$. For multi-nuclear probes several different RF fields may be applied simultaneously or consecutively to stimulate the resonance of two or more nuclei which may be in the sample.

The multiple tuning of the probe is achieved with the aid of one or more additional RF coils and capacitors that are removed physically from the RF coils containing the NMR sample. Typically a spectrometer system is designed to detect protons and deuterium, which is used for set-up and spectrometer frequency control. These two frequencies may be provided by one RF coil by double tuning. Another coil disposed at right angles to this first coil may be double tuned to detect phosphorus-31 and carbon-13. It is often desirable to use the same probe to detect a different second set of nuclei, for example sodium-23 and chlorene-35. Existing probes are generally constructed to operate on a pre-selected one or two frequencies (in addition to protons and deuterium), therefore two or more probes are needed for applications requiring up to four additional frequencies.

U.S. Pat. No. 5,982,179 "NMR Circuit Switch", assigned to the Assignee of the present invention, describes an NMR probe with a stepped cavity for locating switch components therein. For single frequency operation a capacitor switch is activated upon insertion of a capacitor stick. For double frequency operation a ¼ wave stick incorporating a metallic threaded screw that closes a threaded connection switch thereby connecting capacitors internal to the probe and the ¼ wave center connector of the switch to operate cooperatively to permit double frequency operation. To permit operation at different pairs of frequencies an extension stick is used in place of the ¼ wave stick and an external section of wave tube is mounted on the extension stick wherein part of the wave tube is in the probe and part on the stick. For each pair of additional frequencies a different stick and extension tube is required.

SUMMARY OF THE INVENTION

There is therefore a need for a single probe design that facilitates single tune and double tune operation of any pre-selected set of nuclei, that is capable of operating at one or two pre-selected sets of frequencies.

It is a feature of the present invention to provide a probe with a set of wands, each of which provides the tuning for a single or for double frequency operation. The wands for double frequency operation have one or more capacitors and a central conducting rod with an adjustable conductive collar having spring finger contacts that in cooperation with a conducting tube form an adjustable ¼ wave stub and produce double tune operation. The tube may either be fixed to the wand or to the probe. Wands for different set of double frequencies contain capacitors with different values and with the conductive collar set to different positions.

In one embodiment of this invention, the wands for different single frequencies or different sets of double frequencies may be identical in their construction making them easier to construct. The values selected for capacitors within the wand, the way of their connection, and the position of the adjustable collar determine the different frequencies. Single frequency operation is obtained by different electrical connections within the wand. In a preferred embodiment clips hold the capacitors, permitting them to be changed. An electrical jumper may be used in place of a capacitor, or the clip may be left vacant thereby, changing the circuit configuration.

The insertion of the wand into the probe requires no turning or rotating. The wand is inserted directly in the probe: the end of the wand plugs into a keyed electrical socket within the probe. The electrical plug and socket permits changing the probe configuration and operating frequencies, without requiring the wand to be rotated. All the wands can be of the same size and length and still have means for providing for different resonant frequencies of the ¼ wave shorted stub.

An additional feature of the present invention is the low manufacturing cost of the probe and wand, as the mechanical parts of all probes and wands are identical. The electrical socket within the probe and mating electrical plug on the wand provides a low cost method of electrically coupling the wand to the probe.

BRIEF DESCRIPTION OF THE DRAWINGS

FIG. 1A schematically shows a ¼ wave assembly component contained in a wand.

FIG. 1B is a detailed view of a conductive collar part of the wand.

FIG. 1C schematically shows a conductive tube surrounding the ¼ wand assembly.

FIG. 4 schematically shows an electrical circuit contained within the wand.

FIG. 5 schematically shows the electrical circuits contained in the probe.

DETAILED DESCRIPTION OF THE INVENTION

Figure 3:
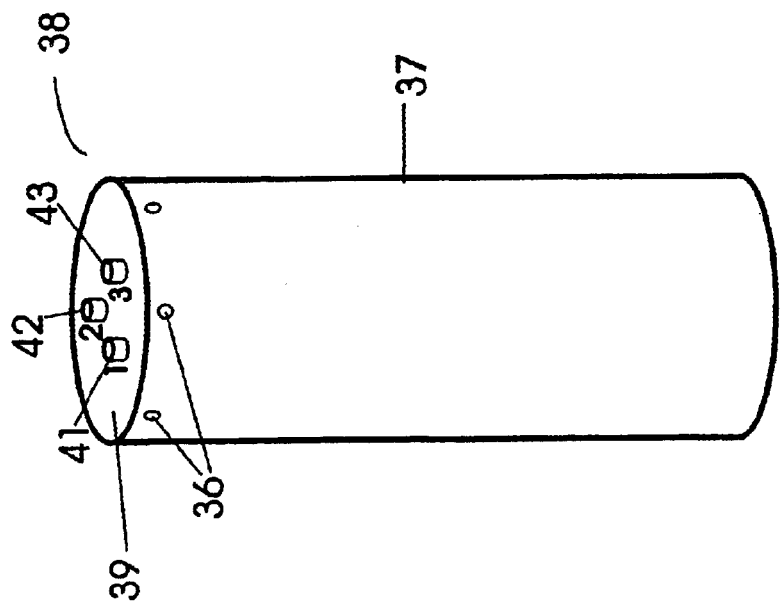
FIG. 3 schematically shows a conductive tube attached to an electrical socket which is located within the probe that receives the wand.

FIG. 1A illustrates the adjustable wand 10 used to select the frequency range of operation of a probe and thereby select the particular nuclei the probe will detect. It determines whether the RF probe coil tunes to a single frequency or is tuned to two frequencies. Double frequency operation is achieved using a ¼ wave assembly. The ¼ wave assembly comprises conducting rod 11, shorting stub 12 and conducting tube 37 of FIG. 1C. Shorting stub 12 comprises collar 13, spring contact 15, and set screw 17. Conducting rod 11 and collar 13 are made of metals with high electrical conductivity such as copper or aluminum. Spring contact 15 may consist of a helical wound coil spring made of a non-magnetic spring metal such as phosphor bronze or non-magnetic stainless steel.

FIG. 1B is a plan view of collar 13 and spring contact 15. When the wand is inserted into conducting tube 37, the spring loops are compressed making good electrical contact between collar 13 and conducting tube 37. Alternatively a series of spring contact fingers (not shown) could be used to provide electrical contact between collar 13 and conducting tube 37 of FIG. 1C. A handle 27 is located at the lower end of conducting rod 11 to facilitate the insertion of the wand into the probe.

The upper end of conducting rod 11 supports platform 19 and electrical plug 20. Electrical plug 20 comprise pins 21, 22, 23 (labeled 1, 2, and 3 respectively) and insulating plug body 25. The geometrical arrangement of the pins is such that there is only one orientation in which pins will match the corresponding socket on the probe. Platform 19 is made of a dielectric material and is fixed to the end of conducting rod 11. Platform 19 supports up to three capacitors 31, 32, 33. For some wand configurations, electrical jumpers replace one or more capacitors or one or more capacitors are left out with no connection as is explained below. Capacitor 31 is connected between pin 21 and conducting rod 11; capacitor 32 between pins 21 and 22; capacitor 33 between pin 23 and conducting rod 1. In one embodiment for single frequency operation a dielectric rod replaces conducting rod 11, and in this case one side of capacitors 31 and 33 are still connected together.

FIG. 1C is a perspective view of a preferred embodiment wherein conducting tube 37 is fixed to wand 10. In this embodiment the position of conductive collar 13 is first adjusted to the required position and then conductive tube 37 is slipped over wand 10 and secured by machine screws 36 threaded into insulating plug body 25 of electrical plug 20.

Figure 2A:
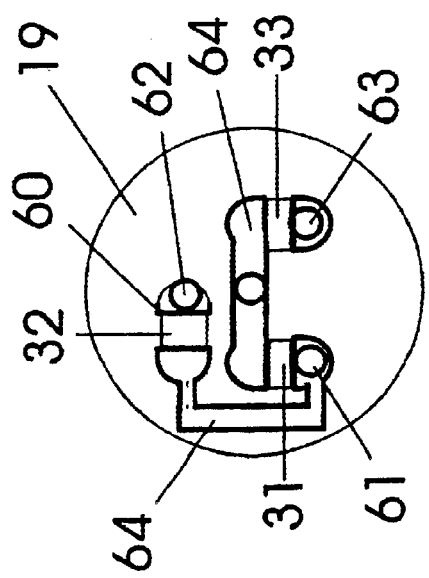
FIG. 2A schematically shows clips used to make electrical contact and retain the capacitors and/or conducting jumpers within the wand.
Figure 2B:
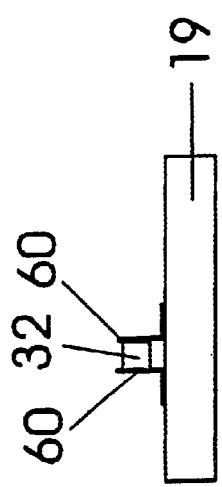
FIG. 2B is a side view of a pair of clips connecting to, and mechanically supporting, a capacitor.

FIG. 2A is a preferred embodiment incorporating an electrical printed circuit 64 printed on platform 19. Small spring clips 60 hold capacitor 31, 32, and 33 in place and provide electrical contact to them. FIG. 2B is a side view showing capacitor 32 supported by two spring clips 60. Spring clips 60 are soldered or otherwise fixed to printed circuit 64. Electrical contact is provided by extension of plug pins 21, 22, and 23 down through holes 61, 62, and 63 respectively, where a solder connection is made to the printed circuit 64. In some configurations one or more clips are left empty, and some clips require an electrical jumper (not shown) to be inserted in place of one or more capacitors. The jumper is a metal object with the same dimensions as a capacitor so it fits within the same space and can be held by clips 60, to provide a low resistance connection between the two clips. Specific circuit configurations of the wand are shown in FIGS. 6A through 9B. The spring clip mountings permit the wand configuration to be easily changed. Alternatively surface amount capacitors may be used and soldered directly to the printed circuit eliminating the need for spring clips 60. Similarly electrical jumpers may also be soldered directly to the printed circuit, or the connection may be left open.

FIG. 3 is preferred embodiment wherein conducting tube 37 is fixed to electrical socket 38, which is mounted in the probe. Electrical socket 38 comprises connector receptacles 41, 42 and 43 (labeled 1, 2, and 3) keyed to receive respective pins 21, 22 and 23 of electrical plug 20. Connector receptacles 41, 42, and 43 are held in place by insulating material 39 of electrical socket 38. Conducting tube 37 is fixed to electrical socket 38 by machine screws 36 that screw into tapped holes in insulating material 39. Conducting tube 37 is a metal tube made of copper or some other metal of high electrical conductivity. Electrical connection is made between conducting tube 37 and connector receptacle 43 (See FIG. 5). When adjustable wand 10 is inserted into conducting tube 37 as shown in FIG. 4, spring 15 establishes a low conductivity electrical connection tube 37 and collar 13 and in cooperation with conducting rod 11 form a ¼ wave shorted stub.

FIG. 4 is a schematic diagram of the electrical circuit within the wand 10 showing capacitors 31, 32, 33 and their connections to pins 21, 22, 23 (labeled 1, 2, 3 on the plug) and to rod 11. In the preferred embodiment spring clip connectors 60 are used to hold the capacitors and to permit their ease of replacement, and for the insertion of an electrical jumper in the place of a capacitor, and for the establishment of an electrical open circuit.

FIG. 5 a schematic diagram of the probe incorporating conducting tube 37 with electrical socket 3S that receives the wand plug and the remaining electrical circuit of the probe. The NMR sample is contained in within NMR probe coil 45 that is located in the magnet in the region containing the most homogeneous magnetic field $B_0$. The outer shell of conducting tube 37 and connector receptacle 43 are connected to probe ground 50. (If the conducting tube 37 is mounted on the wand its electrical ground is established tough pin 23 which plugs into connector receptacle 43 and thereby to probe ground 50). One terminal of circuit variable capacitor Cs 47 and one terminal of wave variable capacitor Ct 46 are connected to probe ground 50. Input and out signals from and to the console (not shown), are made via a coaxial cable connected to probe cable connector 49. Shield connection 51 of probe cable connector 49 goes to probe ground 50, and the electrically active center wire 52 connects to one side of match variable capacitor Cm 48. The other terminal of match variable capacitor Cm 48 connects to the ungrounded terminal of circuit tune capacitor Cs 47, to connector receptacle 42 and to the probe coil 45. The other side of probe coil 45 is connected to the ungrounded terminal of wave variable capacitor 46, and to connector receptacle 41.

The connection arrangement contained in the wand determines whether single frequency of double frequency operation is selected and the values of capacitors contained in the wand determines which nuclei will be detected by the probe. The following figures illustrate how single and double frequency operation is determined and the capacitors that determine the operating frequencies. FIGS. 6A–B and 7A–B show the connection arrangement for single frequency operation and FIGS. 8A–B and 9A–B for double frequency operation.

Figure 6A:
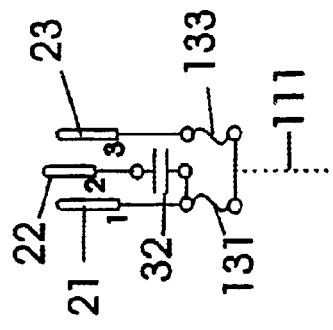
FIG. 6A is a schematic of a first circuit configuration within the wand for single frequency operation.

Single frequency operation of FIG. 6A is achieved by placing electrical jumpers 131 and 133 in place of capacitor 31 and 33 of FIG. 4. Connections to the probe are made through pins 21, 22, 23 (labeled 1, 2, 3 respectively). The circuit is left open in place capacitor 32 of FIG. 4. This combination of connections within the wand when inserted into the probe yields a first circuit configuration for single frequency operation.

Figure 6B:
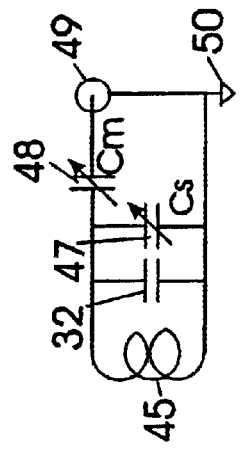
FIG. 6B is a circuit of the equivalent circuit for a probe and wand, with the wand configuration of FIG. 6A.

FIG. 6B is the electrical circuit resulting from the connections selected in FIG. 6A. In this selection the ¼ wave shorted stub is not in the circuit, and is in fact shorted out by jumper 133 of FIG. 6A. If desired a non-conducting rod 111 could replace conducting rod 11 as it does not enter the circuit. Collar 13 with spring contact 15 may also be eliminated. Conducting tube 37 may also be eliminated in the embodiment where tube 37 is normally attached to plug insulator 25 of wand 10. NMR probe coil 45 is tuned by capacitor Cs 47 and matched by capacitor Cm 48. Connection to the console (not shown) are make through coaxial cable connector 49. Shield connection of connector 49 is attached to probe ground 50.

Figure 7A:
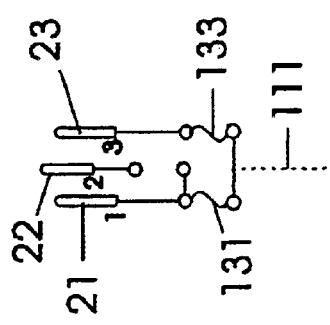
FIG. 7A is a schematic of a second circuit configuration within the wand for single frequency operation at a lower frequency.
Figure 7B:
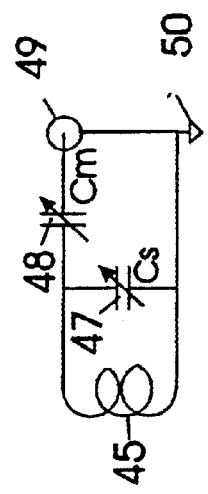
FIG. 7B is a circuit of the equivalent circuit for a probe and wand, with the wand configuration of FIG. 7A.

FIG. 7A is an alternative wand configuration for single frequency operation. It is identical to the wand of FIG. 6A with the change that capacitor 32 is fixed therein. Capacitor 32 is introduced in place of the empty clip of FIG. 6A. This has the property of lowering the resonant frequency of the Probe. For example, at a field strength of 9.4 T (400 MHz proton field), the circuit of FIG. 6B might be tuned for phosphorus 31 at 162 MHz. Carbon 13 at 100.6 MHz could be observed with the same probe using the wand of FIG. 7A by proper choice of capacitor 32. In this configuration ¼ wave shorted stub is not in the circuit being shorted out by electrical jumper 133. Electrical jumper 131 in series with jumper 133 shorts out capacitor Ct 46 of FIG. 5. Plug pins 21, 22, 23 (labeled 1, 2, and 3 respectively) furnish electrical connection means to the probe. The equivalent circuit FIG. 7B shows capacitor 32 is in parallel with circuit variable capacitor Cs 47. The other components of FIG. 7B are identical with those of FIG. 6B, with NMR probe coil 45, matching capacitor Cm 48, connector 49 and ground 50.

Figure 8A:
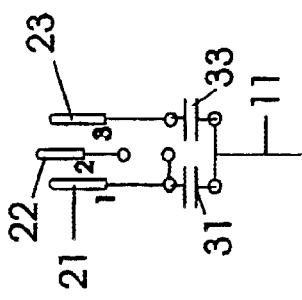
FIG. 8A is a schematic of a first circuit configuration within the wand for double frequency operation.
Figure 8B:
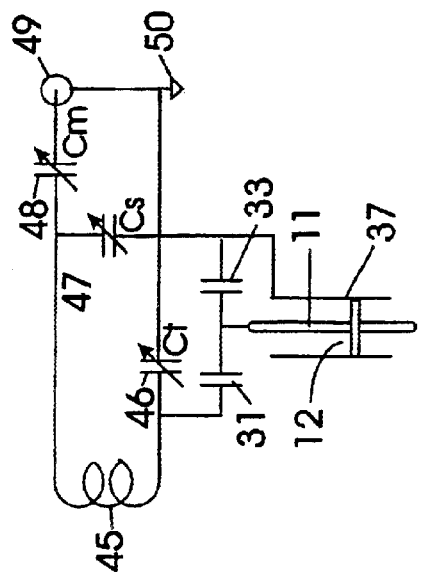
FIG. 8B is a circuit of the equivalent circuit for a probe and wand, with the wand configuration of FIG. 8A.

FIG. 8A is a wand configuration for a double tuned circuit. Here the jumper 133 of FIG. 7A is removed thereby unshorting the ¼ wave structure Capacitors 31 and 33 optimize the coupling of the ¼ wave structure to the probe circuit pins 21, 22, 23 (labeled 1, 2, 3 respectively) provide coupling between the wand and the probe circuit. FIG. 8B is the equivalent circuit for the combination of wand configuration of FIG. 8A and the probe circuit (FIG. 4). In this configuration length of the ¼ wave shorted stub is adjusted by moving shorting stub 12 (FIG. 1A). This is done by loosening set screw 17 and moving collar up or down on rod 11 to the desired position and then tightening set screw 17 (FIG. 1A, 4). Further adjustment is achieved by wave variable capacitor Ct 46. Conducting rod 11, shorting stub 12 and conducting tube 37 comprize a ¼ wave structure. Capacitors 31 and 33 optimize the coupling of the ¼ wave structure to the probe circuit. Probe circuit further comprizes NMR probe coil 45, wave variable capacitor Ct 46, circuit variable capacitor Cs 47 and match variable capacitor Cm 48. Connection to the console (not shown) is made through coaxial cable connector 49. Probe ground connections 50 are made connector 49, conducting tube 37, and capacitors 33, Ct 46, and Cs 47.

Figure 9A:
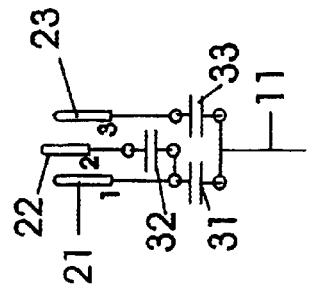
FIG. 9A is a schematic of a second circuit configuration within the wand for double frequency operation.
Figure 9B:
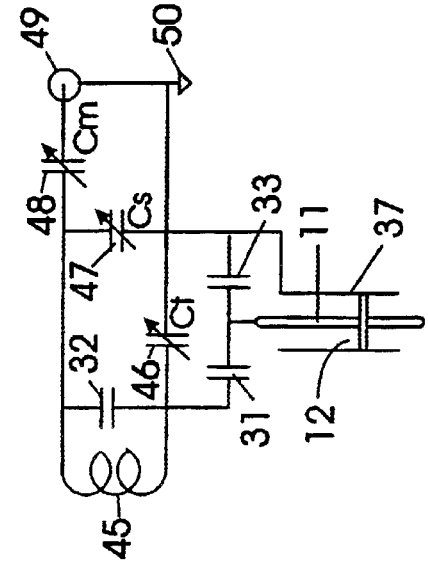
FIG. 9B is a circuit of the equivalent circuit for a probe and wand, with the wand configuration of FIG. 9A.

FIG. 9A is an alternative wand configuration for a double timed circuit. Capacitor 32 is introduced in place of the empty clip of FIG. 8A. The other components of FIG. 9A and their labeling is unchanged from FIG. 8A. The additional capacitor 32 has the property of lowering the resonant frequencies of the probe. The equivalent circuit FIG. 9B shows capacitor 32 is in parallel NMR probe coil 45. The other components of FIG. 9B and their labelings are unchanged from FIG. 8B.

Although the invention has been described herein in its preferred form, those skilled in the art will recognize that many variations and magnifications may be made thereto without departing from the spirit and scope of the invention as defined in the claims.

What is claimed is:

1. An adjustable ¼ wave assembly of NMR spectrometry comprising:
    a probe having a probe coil and probe capacitors, which detect NMR signals;
    a multinuclear frequency adjustable detachable wand comprising:
        a central conducting rod supporting a sliding collar made of electrically conductive material;
        a tube fixed to said probe receiving therein said detachable wand; and
        contacts disposed on a periphery of said sliding collar providing electrical contact with said tube when said detachable wand is inserted into said tube,
        wherein said wand and said tube form a ¼ wave shorted stub.

2. The adjustable ¼ wave assembly of claim 1, further comprising a fastening device, which fixes a position of said sliding collar, on said central conducting rod.

3. The adjustable ¼ wave assembly of claim 2, wherein said probe further comprising:
    an electrical socket that is coupled to said probe coil and said probe capacitors; and said wand further comprising:
        an electrical plug mating to said electrical socket with two or more electrical contacts; and
        electrical wiring providing connection between said probe and said wand.

4. The adjustable ¼ wave assembly of claim 3, wherein said wand further comprising wand capacitors.

5. The adjustable ¼ wave assembly of claim 4, wherein said electrical wiring comprising spring clips mounting said wand capacitors, where a number of said spring clips exceeds or is equal to a number of said wand capacitors providing respectively single or double frequency operation of said probe.

6. The adjustable ¼ wave assembly of claim 3, wherein said wand further comprising electrical jumpers.

7. The adjustable ¼ wave assembly of claim 6, wherein said electrical wiring comprising a number of spring clips mounting said electrical jumpers, wherein the number of said spring clips exceeds or is equal to, a number of said electrical jumpers which respectively provides single or double frequency operation of said probe.

8. The adjustable ¼ wave assembly of claim 5, wherein one of said wand capacitors is connected in parallel with said probe coil which reduces the resonant frequency of said probe.

9. The adjustable ¼ wave assembly of claim 8, wherein said electrical wiring is connected to one or more wand capacitors switching the frequencies of operation of said probe and forming an electrical short circuit across said ¼ wave shorted stub.

10. An adjustable ¼ wave assembly of NMR spectrometry comprising:
    a probe having a probe coil and probe capacitors, which detect NMR signals, and
    a multinuclear frequency adjustable detachable wand having:

a sliding collar made of electrically conductive material;

a central conducting rod supporting said sliding collar;

means for fixing a position of said sliding collar on said central conducting rod;

a tube surrounding said rod and said conducting collar;

finger contacts disposed on the periphery of said conducting collar, providing electrical contact with said tube, wherein said conducting rod, sliding collar and said tube form a ¼ wave shorted stub.

11. The adjustable ¼ wave assembly of claim 10, wherein said probe further comprising:

an electrical socket and said wand further comprising:

a mating electrical plug of two or more electrical PIN contacts forming connections between said probe and said wand when said wand is attached to said probe.

12. The adjustable ¼ wave assembly of claim 11, wherein said electrical socket is coupled to said probe coil and to one or more probe capacitors, with said electrical plug coupled to an electrical wiring.

13. The adjustable ¼ wave assembly of claim 12, wherein said wand further comprising up to three wand capacitors.

14. The adjustable ¼ wave assembly of claim 13, wherein said electrical wiring includes spring clips, that provide selective mounting of said wand capacitors.

15. The adjustable ¼ wave assembly of claim 14, wherein said wand further comprising electrical jumpers.

16. The adjustable ¼ wave assembly of claim 15, wherein said electrical wiring includes spring clips, which provide selective insertion of one or more electrical jumpers.

17. The adjustable ¼ wave assembly of claim 16, wherein one capacitor of said wand is connected in parallel with said probe coil and lowers the resonant frequency of said probe.

18. The adjustable ¼ wave assembly of claim 17, wherein said electric wiring is connected to one or more wand capacitors when switching the frequency of said probe and making it sensitive to a different pair of nuclei.

* * * * *